United States Patent
Chen et al.

(10) Patent No.: US 8,237,499 B2
(45) Date of Patent: Aug. 7, 2012

(54) FEEDFORWARD CONTROLLED ENVELOPE MODULATOR AND FEEDFORWARD CONTROL CIRCUIT THEREOF

(75) Inventors: Chun-Jen Chen, Hsinchu County (TW); Chih-Chang Lee, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 154 days.

(21) Appl. No.: 12/775,486

(22) Filed: May 7, 2010

(65) Prior Publication Data

US 2011/0273235 A1 Nov. 10, 2011

(51) Int. Cl.
*H03G 3/20* (2006.01)
(52) U.S. Cl. ........................................ 330/136
(58) Field of Classification Search ............ 330/136
See application file for complete search history.

(56) References Cited

U.S. PATENT DOCUMENTS

2009/0160555 A1 6/2009 Sun
2009/0215413 A1 8/2009 Ahn et al.

OTHER PUBLICATIONS

Authored by Lee, et al, article titled "A Hybrid Envelope Modulator Using Feedforward Control for OFDM polar Transmitter," adopted from SOC Technical Journal of Industrieal Technology Research Institute, Dec. 2009, vol. 11, pp. 74-81, with English Abstract included.
Authored by Wang, et al, article titled "An Improved Power-Added Efficiency 19-dBm Hybrid Envelope Elimination and Restoration Power Amplifier for 802.11g WLAN Applications," adopted from IEEE Transactions on Microwave Theory and Techniques, vol. 54, No. 12, Dec. 2006, pp. 4086-4099.
Authored by Pinon, et al, article titled "A single-chip WCDMA envelope reconstruction LDMOS PA with 130MHz switched-mode power supply," adopted from 2008 IEEE International Solid-State circuits Conference, pp. 564-565 and with a continuous p. 636.
Authored by Wang, et al, article titled "A monolithic high-efficiency 2.4-GHz 20-dBm SiGe BiCMOS envelope-tracking OFDM power amplifier," adopted from IEEE Journal of Solid-State circuits, vol. 42, No. 6 Jun. 2007, pp. 1271-1281.
Authored by Kazimierczuk, et al, article titled "Feedforward control of DC-DC PWM boost converter," adopted from IEEE Transactions on Circuits and Systems—I: Fundamental Theory and Applications, vol. 44, No. 2 Feb. 1997, pp. 143-148.
Authored by Kwak, et al, article titled "A 2W CMOS hybrid switching amplitude modulator for EDGE polar transmitters," adopted from 2007 IEEE International Solid-State circuits Conference, pp. 518-519 and with a continuous p. 619.
Authored by Lee, et al, article titled "A Hybrid Envelope Modulator Using Feedforward Control for OFDM WLAN Polar Transmitter," adopted from Radio Frequency Integrated Circuits Symposium, 2009. RFIC 2009. IEEE, Jun. 2009, pp. 141-144.

*Primary Examiner* — Robert Pascal
*Assistant Examiner* — Khiem Nguyen
(74) *Attorney, Agent, or Firm* — Jianq Chyun IP Office

(57) ABSTRACT

The present disclosure illustrates a feedforward controlled envelope modulator and a feedforward control circuit thereof. The feedforward controlled envelope modulator comprises a linear amplifier circuit, a switching amplifier, and a feedforward control circuit. The linear amplifier circuit amplifies an input voltage signal, so as to output an output voltage signal to a load node. The switching amplifier receives a comparison signal, and outputs a switching current to the load node according to the comparison signal. The feedforward control circuit comprises a duplicate linear amplifier circuit and a hysteresis comparator. The duplicate linear amplifier circuit amplifies the input voltage signal, so as to output a reference voltage signal, wherein an amplifying gain of the duplicate linear amplifier circuit is identical to an amplifying gain of the linear amplifier circuit. The hysteresis comparator compares the output voltage signal and the reference voltage signal, so as to output the comparison signal.

25 Claims, 11 Drawing Sheets

US 8,237,499 B2

FEEDFORWARD CONTROLLED ENVELOPE MODULATOR AND FEEDFORWARD CONTROL CIRCUIT THEREOF

BACKGROUND OF THE INVENTION

1. Technical Field

The present disclosure generally relates to a polar transmitter and more particularly to a feedforward controlled envelope modulator for a polar transmitter having envelope tracking (ET) or envelope elimination and restoration (EER) function and a feedforward control circuit thereof.

2. Description of Related Art

The communication technology develops very fast, and most people have a handheld communication device in the usual life. The handheld communication device generally comprises a transmitter and a receiver. The transmitter has a power amplifier therein which consumes a great part of total power consumption in transmission link.

Furthermore, regarding a multiple carrier communication system, partial signals have high peak-to-averaged power ratios. Though the multiple carrier communication system provides the high data rate, the required large dynamic rage of power amplifier resulting in low power efficiency.

Due to the low power efficiency of the power amplifier, the lifetime of the battery of the handheld communication device is reduced, and the environment temperature is increased. Since the environment temperature is increased, the problem of bias drift is occurred in the handheld communication device.

Accordingly, a polar power amplifier used in a transmitter is provided to achieve both of the high linearity and the high power efficiency. The polar transmitter can be a polar transmitter having ET function or EER function. Referring to FIG. 1A, FIG. 1A is a block diagram showing a polar transmitter having ET function. The polar power transmitter 10 comprises a power amplifier 102, an envelope amplifier 104, a digital signal processing unit 106, a quadrature upconverter 108, and a transmitting antenna 110.

The in-phase signal I and the quadrature signal Q are received by the digital signal processing circuit 106, and the digital signal processing circuit 106 outputs the amplitude signal A(t), the processed in-phase signal I(t) and the processed quadrature signal Q(t). The quadrature upconverter outputs the converted signal $A(t)e^{j(\omega t+\phi(t))}$, wherein the amplitude signal A(t) is expressed as, $A(t)=\sqrt{I^2(t)+Q^2(t)}$, $\omega$ is the oscillating frequency, t is the variable of time, and the phase signal $\phi(t)$ is expressed as $\phi(t)=\tan^{-1}(Q(t)/I(t))$.

Referring to FIG. 1B, FIG. 1B is a block diagram showing a polar transmitter having EER function. The polar power transmitter 15 comprises a power amplifier 152 of class E type, an envelope amplifier 154, a digital signal processing unit 156, a quadrature upconverter 158, and a transmitting antenna 160.

The in-phase signal I and the quadrature signal Q are received by the digital signal processing circuit 156, and the digital signal processing circuit 156 outputs the amplitude signal A(t), the processed in-phase phase signal $I_P(t)$ and the processed quadrature phase signal $Q_P(t)$. The quadrature upconverter outputs the converted signal $e^{j(\omega t+\phi(t))}$, wherein the amplitude signal A(t) is expressed as, $A(t)=\sqrt{I^2(t)+Q^2(t)}$, $\omega$ is the oscillating frequency, t is the variable of time, the phase signal $\phi(t)$ is expressed as $\phi(t)=\tan^{-1}(Q(t)/I(t))$, the in-phase phase signal $I_P(t)$ is expressed as $I_P(t)=\cos(\phi(t))$, and the processed quadrature phase signal $Q_P(t)$ is expressed as $Q_P=\sin(\phi(t))$.

The polar power amplifier mentioned above is mainly composed of the power amplifier and the envelope amplifier, and the total power efficiency thereof is a product of power efficiencies of the power amplifier and the envelope amplifier. For a long term evolution system, a worldwide interoperability for microwave access system, a wireless local area network system, or a wideband code multiple access system, the envelope amplifier is required to achieve both wideband operation and high power efficiency.

The envelope amplifier can be implemented by a linear regulator, a switching regulator, or a current feedback hybrid envelope modulator. The envelope amplifier implemented by the linear regulator has wideband operation, but low power efficiency. The envelope amplifier implemented by the switching regulator has high power efficiency, but narrowband operation. The envelope amplifier implemented by the current feedback hybrid envelope modulator has medium power efficiency and wideband operation, but the transient response thereof is low.

The envelope amplifier implemented by the current feedback hybrid envelope modulator has a hysteretic current feedback path, and a small current sensing resistor is located in the hysteretic current feedback path. Due to the current feedback control mechanism, the transient response of the envelope amplifier is low, and thus for the wideband or high speed signals, the partial current from the switching regulator will be bypassed to ground through linear amplifier, which results in power inefficiency. Furthermore, the current sensing resistor must be small to reduce power consumption, which is difficulty to be implemented in the integrated circuit design.

SUMMARY

According to an exemplary embodiment of the present disclosure, a feedforward controlled envelope modulator is provided. The feedforward controlled envelope modulator comprises a linear amplifier circuit, a switching amplifier, and a feedforward control circuit. The linear amplifier circuit amplifies an input voltage signal, so as to output an output voltage signal to a load node. The switching amplifier receives a comparison signal, and outputs a switching current to the load node according to the comparison signal. The feedforward control circuit comprises a duplicate linear amplifier circuit and a hysteresis comparator. The duplicate linear amplifier circuit amplifies the input voltage signal, so as to output a reference voltage signal, wherein an amplifying gain of the duplicate linear amplifier circuit is identical to an amplifying gain of the linear amplifier circuit. The hysteresis comparator compares the output voltage signal and the reference voltage signal, so as to output the comparison signal.

According to an exemplary embodiment of the present disclosure, a feedforward control circuit used in a feedforward controlled envelope modulator is provided. The feedforward control circuit comprises a duplicate linear amplifier circuit and a hysteresis comparator. The duplicate linear amplifier circuit amplifies an input voltage signal, so as to output a reference voltage signal, wherein an amplifying gain of the duplicate linear amplifier circuit is identical to an amplifying gain of a linear amplifier circuit of the feedforward controlled envelope modulator, and the linear amplifier circuit amplifies an input voltage signal, so as to output an output voltage signal to a load node of the feedforward controlled envelope modulator. The hysteresis comparator compares the output voltage signal and the reference voltage signal, so as to output the comparison signal to a switching amplifier of the feedforward controlled envelope modulator, wherein the a switching amplifier receives a comparison signal, and outputs a switching current to the load node according to the comparison signal.

To sum up, by using the feedforward control mechanism, the linear amplifier circuit and the switching amplifier of the feedforward controlled envelope modulator can output a stable output current, so as to improve the efficiency of the polar transmitter. Thus, it might save the energy of the battery of the handheld communication device.

It is to be understood that both the foregoing general description and the following detailed description are exemplary, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EXEMPLARY EMBODIMENTS

Figure 1A:
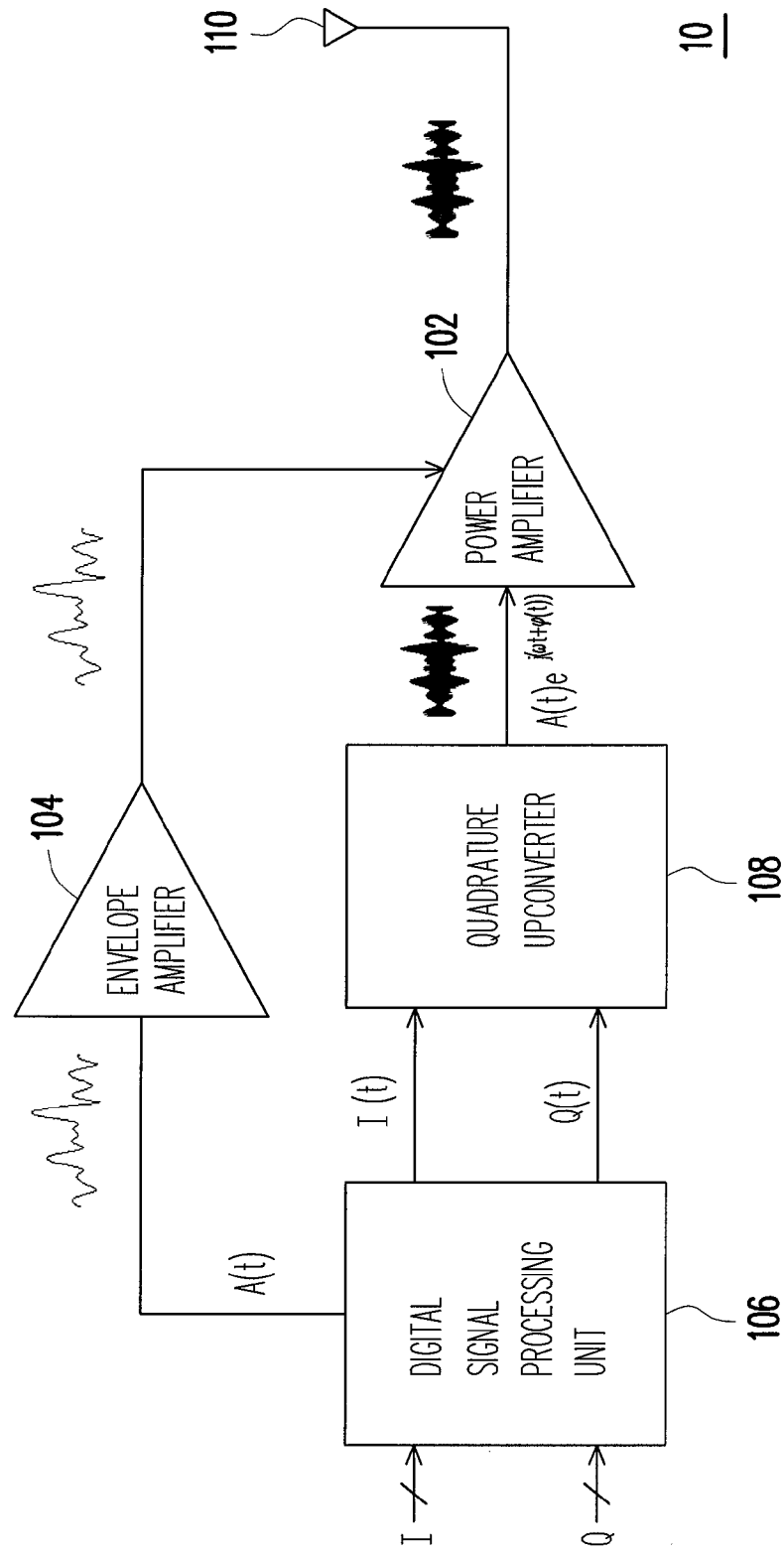
FIG. 1A is a block diagram showing a polar transmitter having ET function.
Figure 1B:
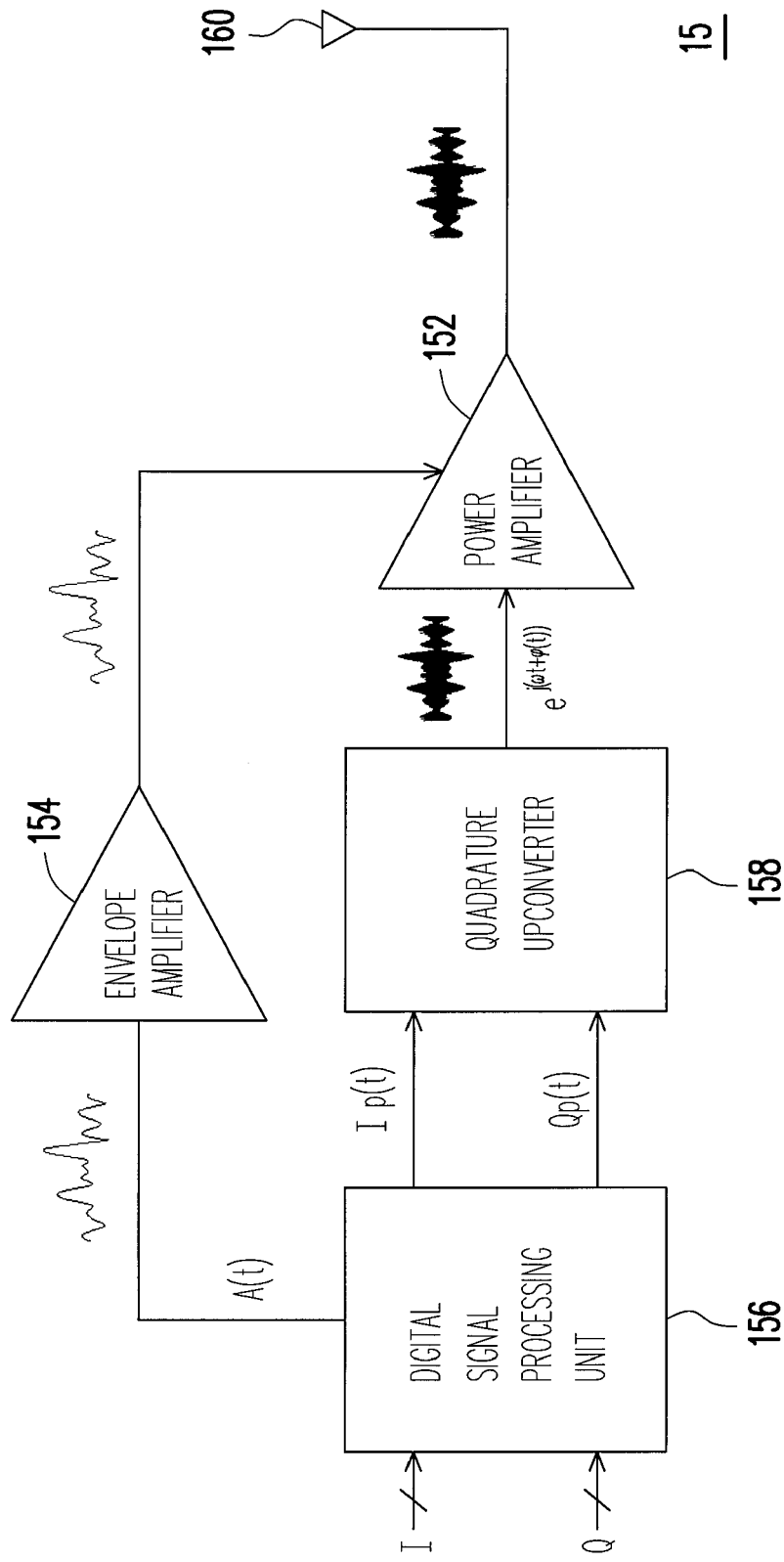
FIG. 1B is a block diagram showing a polar transmitter having EER function.

Exemplary embodiments are described more fully hereinafter with reference to the accompanying drawings. Exemplary embodiments may, however, be in many different forms and should not be construed as limited to the exemplary embodiments set forth herein. Rather, these exemplary embodiments are provided so that this disclosure will be thorough and complete, and will fully convey the scope to those skilled in the art. In the drawings, the size and relative sizes of components may be exaggerated for clarity. Throughout the drawings, like reference numerals refer to like components.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the exemplary embodiments.

The terminology used herein is for the purpose of describing particular exemplary embodiments only and is not intended to be limiting. As used herein, the singular forms "a", "an", and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
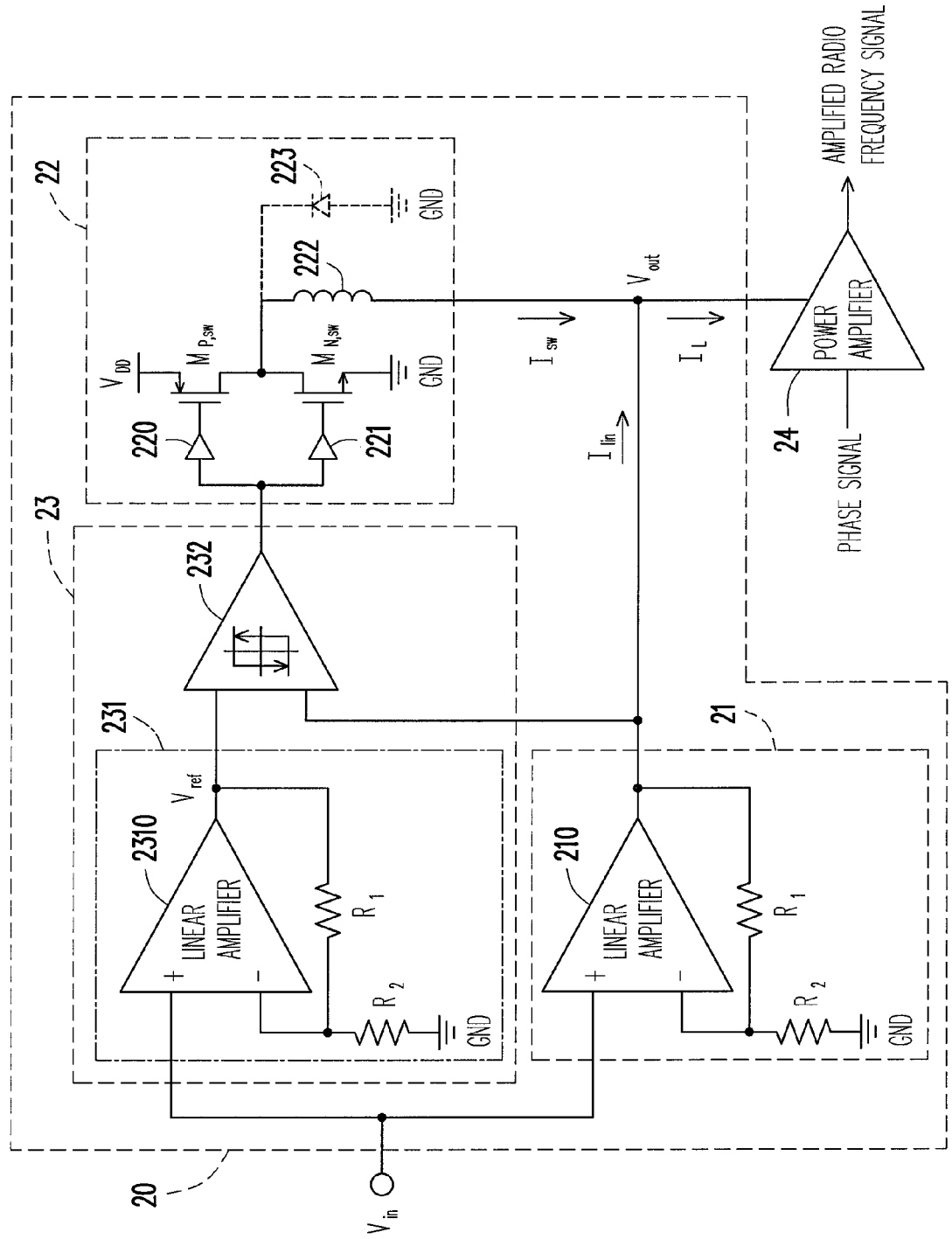
FIG. 2 is a block diagram showing a feedforward controlled envelope modulator according to an exemplary embodiment of the present disclosure.

Referring to FIG. 2, FIG. 2 is a block diagram showing a feedforward controlled envelope modulator according to an exemplary embodiment of the present disclosure. The feedforward controlled envelope modulator 20 comprises a linear amplifier circuit 21, a switching amplifier 22, and a feedforward control circuit 23. The linear amplifier circuit 21 is coupled to the switching amplifier 22, the feedforward control circuit 23, and the power amplifier 24. The switching amplifier 22 is coupled to the feedforward control circuit 23 and the power amplifier 24.

The linear amplifier circuit 21 amplifies an input voltage signal $V_{in}$, so as to output an output voltage signal $V_{out}$ to a load node, thus a current $I_{lin}$ provided by the linear amplifier circuit 21 flows into the load node. The switching amplifier 22 receives a comparison signal output from the feedforward control circuit 23, and outputs a switching current $I_{sw}$ to the load node according to the comparison signal.

The power amplifier 24 has a bias terminal coupled to the load node, and is used to amplify a phase signal or modulated signal, so as to output an amplified radio frequency signal. To put it more concretely, the bias terminal of the power amplifier receives a biasing current $I_L$ which is a composition of the current $I_{lin}$ and the switching current $I_{sw}$.

The feedforward control circuit 23 comprises a duplicate linear amplifier circuit 231 and a hysteresis comparator 232. The duplicate linear amplifier circuit 231 is coupled to the hysteresis comparator 232. The duplicate linear amplifier circuit amplifies the input voltage signal $V_{in}$, so as to output a reference voltage signal $V_{ref}$, wherein an amplifying gain of the duplicate linear amplifier circuit 231 is identical to an amplifying gain of the linear amplifier circuit 21. The hysteresis comparator 232 compares the output voltage signal $V_{out}$ and the reference voltage signal $V_{ref}$, so as to output the comparison signal.

The feedforward control circuit 23 provides a feedforward control mechanism to directly control the switching amplifier 22, and thus the small current sensing resistor and the hysteretic current feedback path might not be used. Therefore, the feedforward controlled envelope modulator 20 has the high transient response. That is, the feedforward controlled envelope modulator 20 can process the voltage signal with the wide range (i.e. the linearity thereof is improved) and the fast varying signal.

The linear amplifier circuit 21 comprises a linear amplifier 210, a first resistor $R_1$, and a second resistor $R_2$. The linear amplifier 210 has a positive input end, a negative input end, and an output end, wherein the positive input end receives the input voltage signal $V_{in}$, and the negative input end is coupled to the ground via the second resistor $R_2$, and coupled to the output end via the first resistor $R_1$. The duplicate linear amplifier circuit 231 comprises a linear amplifier 2310, a first resistor $R_1$, and a second resistor $R_2$. It is noted that the architecture of the linear amplifier circuit 21 is identical to the architecture of the duplicate linear amplifier circuit 231, and thus the description about the architecture of the duplicated linear amplifier circuit 231 is omitted.

The gains of the linear amplifier circuit 21 and the duplicate linear amplifier circuit 231 are designed to be 10 (i.e. $R_1=9R_2$), so as to amplify the weak input voltage signal $V_{in}$. However, values of the gains of the linear amplifier circuit 21 and the duplicate linear amplifier circuit 231 are not used to limit the present disclosure. For example, the gains of the linear amplifier circuit 21 and the duplicate linear amplifier circuit 231 may be designed to be 2 (i.e. $R_1=R_2$), when the input voltage signal $V_{in}$ is strong. If the input voltage signal $V_{in}$ is large enough, the linear amplifier circuit 21 and the duplicate linear amplifier circuit 23 can be arranged to be buffers (i.e. no resistors exist in the linear amplifier circuit 21 and the duplicate linear amplifier circuit 23, and the output ends of the linear amplifiers 2310 and 210 are coupled to their negative input ends.).

Though the architecture of the linear amplifier circuit 21 is identical to the architecture of the duplicate linear amplifier circuit 231, the power consumption of the linear amplifier circuit 21 is different from the power consumption of the duplicate linear amplifier circuit 231. Because an output impedance of the duplicate linear amplifier circuit 231 is an input impedance of the hysteresis comparator 232 which is ultra larger than the output impedance of the linear amplifier circuit 231, a biasing current for driving the linear amplifier 2310 of the duplicate linear amplifier circuit 231 is ultra less than a biasing current for driving the linear amplifier 210 of the linear amplifier circuit 21.

Since the biasing current for driving the linear amplifier 2310 of the duplicate linear amplifier circuit 231 is ultra less than the biasing current for driving the linear amplifier 210 of the linear amplifier circuit 21, the linear amplifier 2310 of the duplicate linear amplifier circuit 231 is designed to have the characteristics of small area and low power consumption, so as to avoid affecting the efficiency of the feedforward controlled envelope modulator 20. Thus it might save the energy of the battery in the handheld communication device.

In FIG. 2, one exemplary embodiment for implementing the switching amplifier 22 is shown, but not used to limit the present disclosure. The switching amplifier 22 comprises a first buffer 220, a second buffer 221, a first switching transistor $M_{P,sw}$, a second switching transistor $M_{N,sw}$, an inductive load 222, and a diode 223. The diode 223 might not be a necessary element of the switching amplifier 22, and the diode 223 might be removed in the other exemplary embodiment. The first switching transistor $M_{P,sw}$ is a P-type metal-oxide-semiconductor (PMOS) transistor. The second switching transistor $M_{N,sw}$ is a N-type metal-oxide-semiconductor (NMOS) transistor. The inductive load 222 can be an external inductance or an inductance implemented by the semiconductor.

Input ends of the first and second buffers 220, 221 are coupled to an output end of the hysteresis comparator 232, so as to buffer the comparison signal. An output end of the first buffer 220 is coupled to a gate of the first switch transistor $M_{P,sw}$, and an output end of the second buffer 221 is coupled to a gate of the second switching transistor $M_{N,sw}$. One end of the inductive load 222 is coupled to drains of the first and second switching transistors $M_{P,sw}$, $M_{N,sw}$, and the other end of the inductive load 222 is coupled to the load node. Sources of the first and second switching transistors $M_{N,sw}$, are respectively coupled to a power voltage $V_{DD}$ and a ground GND. An input end of the diode 223 is coupled to the ground, and an output end of the diode 223 is coupled to the drains of the first and second switching transistors $M_{P,sw}$, $M_{N,sw}$.

The linear amplifier circuit 21 of the feedforward controlled envelope modulator 20 has the high linearity, resulting the feedforward controlled envelope modulator 20 can process the voltage signal with the wide range. The switching amplifier 22 of the feedforward controlled envelope modulator 20 has the high efficiency. The linear amplifier circuit 21 is designed to provide the enough biasing current to the load node even when a frequency of the voltage signal is over several megahertz, because the switching amplifier 22 can not fast provide the biasing current to the load node without affecting the efficiency when the frequency of the voltage signal is over several megahertz.

The linear amplifier circuit 21 and the switching amplifier 22 form a master-slave relation by the feedforward control mechanism. Since the reference voltage signal $V_{ref}$ is not generated by the hysteretic current feedback path, but generated by directly amplifying the input voltage signal $V_{in}$, such that the feedforward controlled envelope modulator 20 can process the packet signal having the high speed and wide voltage range, such as the packet signal of the IEEE 802.11g standard or the other high speed communication standard. In addition, the bandwidth of the feedforward controlled envelope modulator 20 is improved, since the feedforward control circuit 23 provides the enough driving ability to the first and second buffers 220, 221 of the switching amplifier 22, such that the first and second switching transistors $M_{P,sw}$, $M_{N,sw}$ can be fast switched on or off when the frequency of the voltage signal is about several kilohertz.

When the input voltage signal is fed into the feedforward controlled envelope modulator 20 to be amplified, if the output voltage signal $V_{out}$ is less than the reference voltage signal $V_{ref}$, the hysteresis comparator 232 will drive the switching amplifier 22, such that the first switching transistor $M_{P,sw}$ is switched on, and the second switching transistor $M_{N,sw}$ is switched off. The switching current $I_{sw}$ is then provided to the load node until the output voltage signal $V_{out}$ is larger than the reference voltage signal $V_{ref}$. If the output voltage signal $V_{out}$ is larger than the reference voltage signal $V_{ref}$, the first switching transistor $M_{P,sw}$ will be switched off, and the second switching transistor $M_{N,sw}$ is switched on, such that the inductive load 222 is directly coupled to the ground GND.

To make the transient response be as fast as the input voltage signal $V_{in}$, an inductance value of the inductive load 222 and a hysteresis parameter h of the hysteresis comparator 232 must be designed well, such that the slew rate can be increased enough. Though the small hysteresis parameter h of the hysteresis comparator 232 can increase an average switching frequency of the switching amplifier 22, it adds the difficulty for designing the hysteresis comparator 232 with the small hysteresis parameter h. Therefore, in the exemplary embodiment, the inductive load 222 can be an external inductance, and a proper inductance value of the inductive load 222 is selected to increase the average switching frequency of the switching amplifier 22. It is noted that, the implementation of the inductive load 222 is not used to limit the present disclosure, and as mentioned above, the inductive load 222 may be implemented by the semiconductor.

Figure 3A:
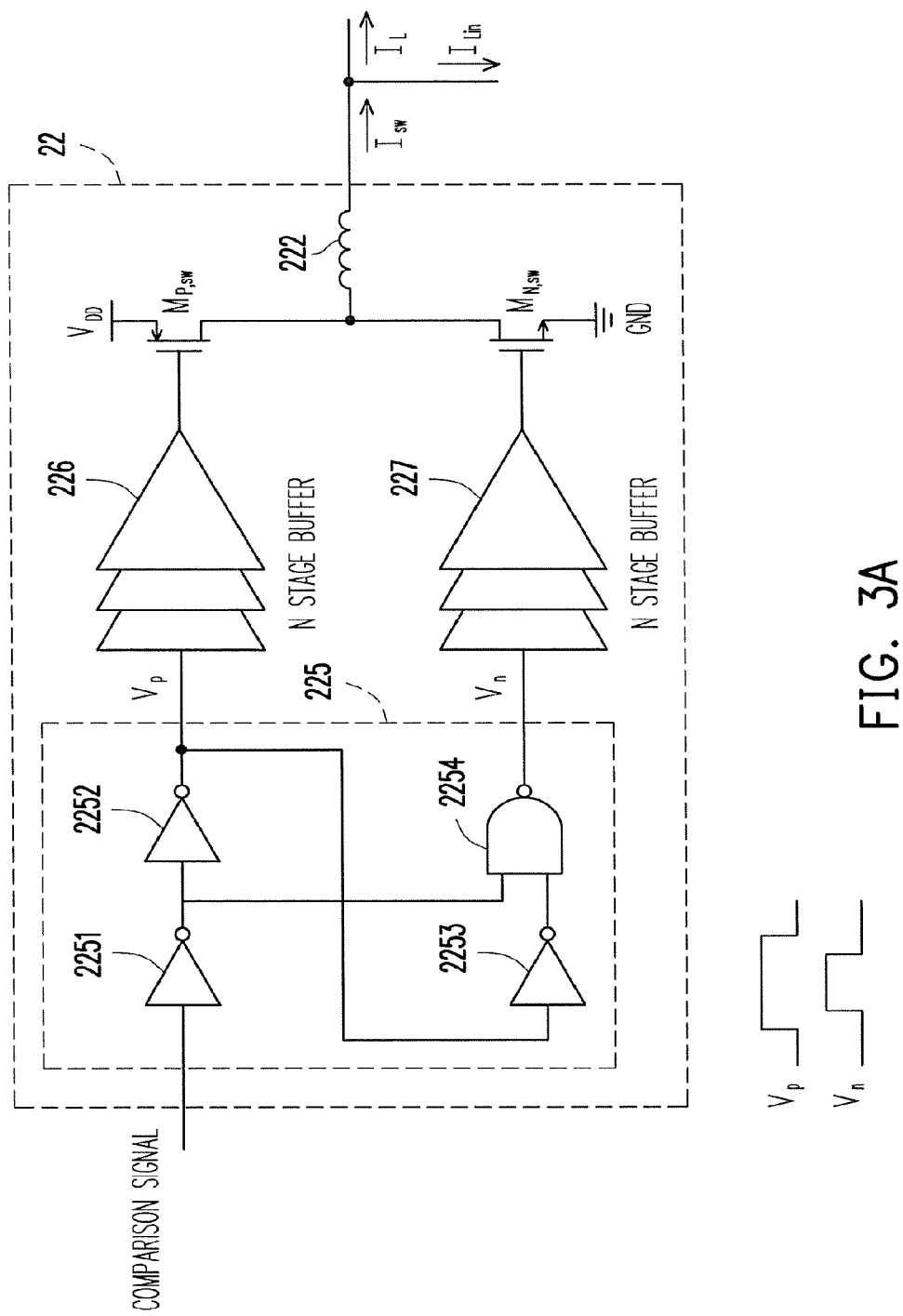
FIG. 3A is a circuit diagram showing a switching amplifier according to one exemplary embodiment of the present disclosure.

Referring to FIG. 3A, FIG. 3A is a circuit diagram showing a switching amplifier according to one exemplary embodiment of the present disclosure. The switching amplifier 22 comprises a dead time generator 225, two N-stage buffers 226, 227, a first switching transistor $M_{P,sw}$, a second switching transistor $M_{N,sw}$, and an inductive load 222, wherein N is an positive integer larger than 0.

The dead time generator 225 comprises three inverters 2251-2253 and a NAND gate 2254. An input terminal of the inverter 2251 receives the comparison signal, and an input terminal of the inverter 2252 is coupled to an output terminal of the inverter 2251. An output terminal of the inverter 2252 is coupled to an input terminal of the inverter 2253 and an input terminal of the N stage buffer 226. Two input terminals of the NAND gate 2254 are respectively coupled to output terminals of the inverters 2251 and 2253, and an output terminal is coupled to an input terminal of the N stage buffer 227. Two output terminals of the N-stage buffers 226 are respectively coupled to gates of the first and second switching transistors $M_{P,sw}$ and $M_{N,sw}$.

A source of the second switching transistor $M_{N,sw}$ is coupled to the ground GND, and a source of the first switching transistor $M_{P,sw}$ is coupled to the power voltage $V_{DD}$. Drains of first and second switching transistors $M_{P,sw}$ and $M_{N,sw}$ are coupled to one end of the inductive load 222, and the other end of the inductive load 222 is coupled to an output terminal of the switching amplifier 22. The dead time generator 225 is used to prevent the shoot-through loss, since the duty cycle of the signal $V_n$ is occurred in the duty cycle of the signal $V_P$ as shown in FIG. 3A.

Figure 3B:
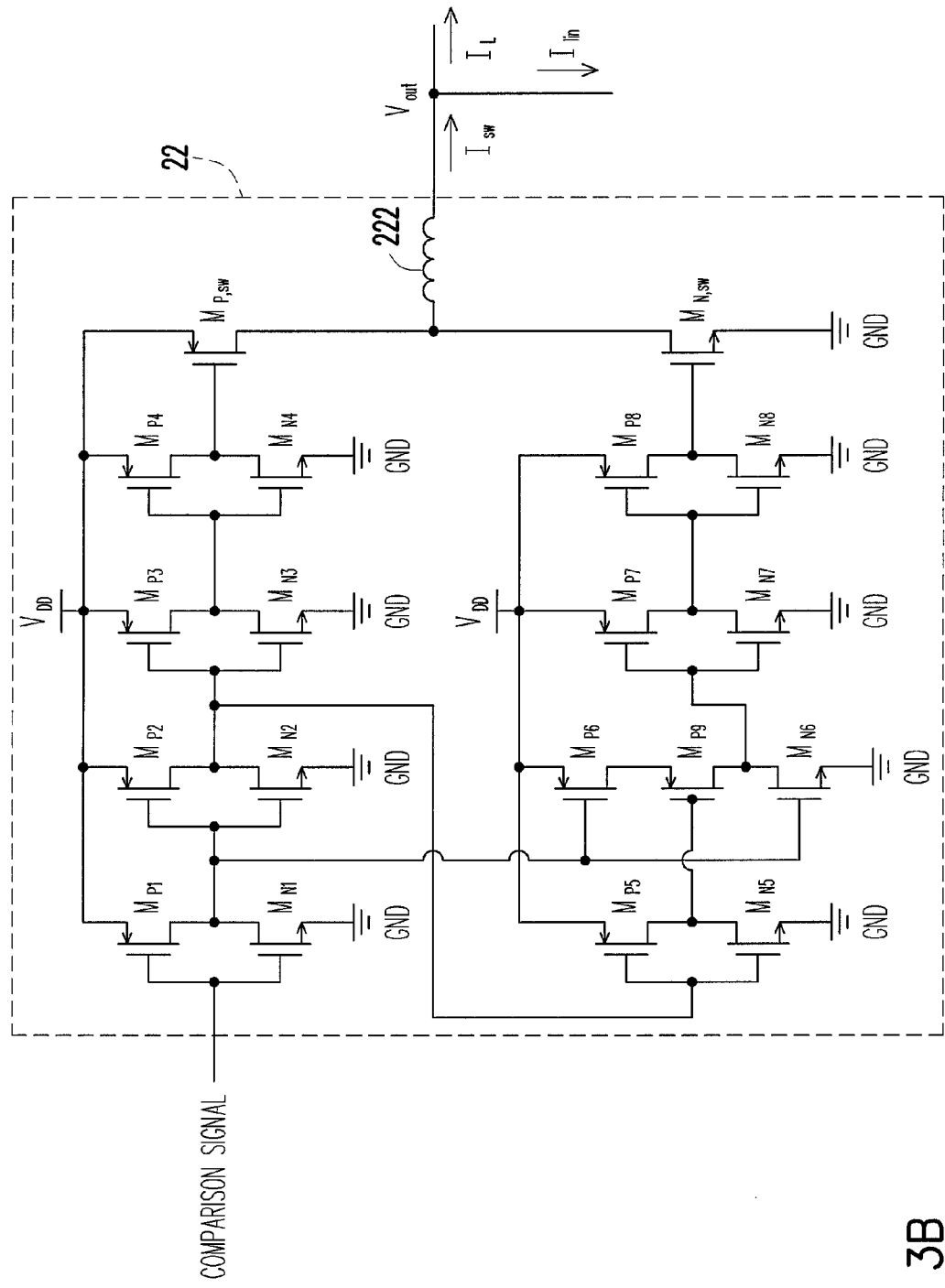
FIG. 3B is a detailed circuit diagram showing a switching amplifier of FIG. 3A according to one exemplary embodiment of the present disclosure.

Referring to FIG. 3B, FIG. 3B is a detailed circuit diagram showing a switching amplifier of FIG. 3A according to one exemplary embodiment of the present disclosure. The switching amplifier 22 comprises PMOS transistors $M_{P1}$~$M_{P9}$, NMOS transistors $M_{N1}$~$M_{N8}$, a first switching transistor $M_{P,sw}$, a second switching transistor $M_{N,sw}$, and an inductive load 222. The switching amplifier 22 in FIG. 3A or FIG. 3B does not have the diode. The PMOS transistors $M_{P3}$~$M_{P4}$ and the NMOS transistors $M_{N3}$~$M_{N4}$ form the first buffer 220 shown in FIG. 2 or the N stage buffer 226 in FIG. 3A, and the PMOS transistors $M_{P7}$~$M_{P8}$, and the NMOS transistors $M_{N7}$~$M_{N8}$ form the second buffer 220 shown in FIG. 2 or the N stage buffer 227 in FIG. 3A. The PMOS transistors $M_{P1}$~$M_{P2}$, $M_{P5}$~$M_{P6}$, $M_{P9}$, and the NMOS transistors $M_{N1}$~$M_{N2}$, $M_{N5}$~$M_{N6}$ form the dead time generator 225 in FIG. 3A. To put it more concretely, the PMOS and NMOS transistors $M_{P1}$, $M_{N1}$ form the inverter 2251 in FIG. 3A; the PMOS and NMOS transistors $M_{P2}$, $M_{N2}$ form the inverter 2252 in FIG. 3A; the PMOS and NMOS transistors $M_{P5}$, $M_{N5}$ form the inverter 2253 in FIG. 3A; and the PMOS and NMOS transistors $M_{P6}$, $M_{P9}$, $M_{N6}$ form the NAND gate 2254.

Gates of NMOS and PMOS transistors $M_{N1}$, $M_{P1}$ receive the comparison signal. Drains of the NMOS and PMOS transistors $M_{N1}$, $M_{P1}$ are coupled to each other. Gates of NMOS and PMOS transistors $M_{N2}$, $M_{P2}$ are coupled to the drains of the NMOS and PMOS transistors $M_{N1}$, $M_{P1}$. Drains of the NMOS and PMOS transistors $M_{N2}$, $M_{P2}$ are coupled to each other. Gates of NMOS and PMOS transistors $M_{N3}$, $M_{P3}$ are coupled to the drains of the NMOS and PMOS transistors $M_{N2}$, $M_{P2}$. Drains of the NMOS and PMOS transistors $M_{N3}$, $M_{P3}$ are coupled to each other. Gates of NMOS and PMOS transistors $M_{N4}$, $M_{P4}$ are coupled to the drains of the NMOS and PMOS transistors $M_{N3}$, $M_{P3}$. Drains of the NMOS and PMOS transistors $M_{N4}$, $M_{P4}$ are coupled to each other.

Gates of the NMOS and PMOS transistors $M_{N5}$, $M_{P5}$ are coupled to the drains of the NMOS and PMOS transistors $M_{N2}$, $M_{P2}$. Drains of the NMOS and PMOS transistors $M_{N5}$, $M_{P5}$ are coupled to each other. A gate of the PMOS transistor $M_{P9}$ is coupled to the drains of the NMOS and PMOS transistors $M_{N5}$, $M_{P5}$. Gates of the NMOS and PMOS transistors $M_{N6}$, $M_{P6}$ are coupled to the drains of the NMOS and PMOS transistors $M_{N1}$, $M_{N}$. Drains of the PMOS transistor $M_{P9}$ and NMOS transistor $M_{N6}$ are coupled to each other. A drain of the PMOS transistor $M_{P6}$ is coupled to a source of the PMOS transistor $M_{P9}$. Gates of the NMOS and PMOS transistors $M_{N7}$, $M_{P7}$ are coupled to the drains of the PMOS transistor $M_{P9}$ and NMOS transistor $M_{N6}$. Drains of the NMOS and PMOS transistors $M_{N7}$, $M_{P7}$ are coupled to each other. Gates of the NMOS and PMOS transistors $M_{N8}$, $M_{P8}$ are coupled to the drains of the NMOS and PMOS transistors $M_{N7}$, $M_{P7}$. Drains of the NMOS and PMOS transistors $M_{N8}$, $M_{P8}$ are coupled to each other. Sources of the PMOS transistors $M_{P1}$~$M_{P9}$ are coupled to the power voltage $V_{DD}$, and sources of NMOS transistors $M_{N1}$~$M_{N8}$ are coupled to the ground GND.

The gate of the first switching transistor $M_{P,sw}$ is coupled to the drains of the NMOS and PMOS transistors $M_{N4}$, $M_{P4}$, and the source of the first switching transistor $M_{P,sw}$ is coupled to the power voltage $V_{DD}$. A gate of the second switching transistor $M_{N,sw}$ is coupled to the drains of the NMOS and PMOS transistors $M_{N8}$, $M_{P8}$, and a source of the second switching transistor $M_{N,sw}$ is coupled to the ground GND.

To avoid the first and second switching transistors $M_{P,sw}$, $M_{N,sw}$ are switched simultaneously, the architecture of dead time generator 225 in the switching amplifier 22 is designed as shown in FIG. 3A or FIG. 3B, so as to prevent the shoot-through loss. The PMOS transistors $M_{P1}$~$M_{P9}$ and the NMOS transistors $M_{N1}$~$M_{N8}$ form the non-overlapping buffers 220 and 221, which generate a delay tap to form a dead-time to the first and second switching transistors $M_{P,sw}$, $M_{N,sw}$. The dead-time must be a proper time, since the first and second switching transistors $M_{P,sw}$, $M_{N,sw}$ may be damaged when the dead-time is too long or too short. The damage of the first and second switching transistors $M_{P,sw}$, $M_{N,sw}$ is caused by the substantial diode and the parasitical capacitors in the first and second switching transistors $M_{P,sw}$, $M_{N,sw}$. The switching amplifier 22 provides the switching current $I_{sw}$ having a speed slower than that of the biasing current $I_L$, and the inductive load 222 is an external inductance of 5.6 μH in the exemplary embodiment.

Figure 4:
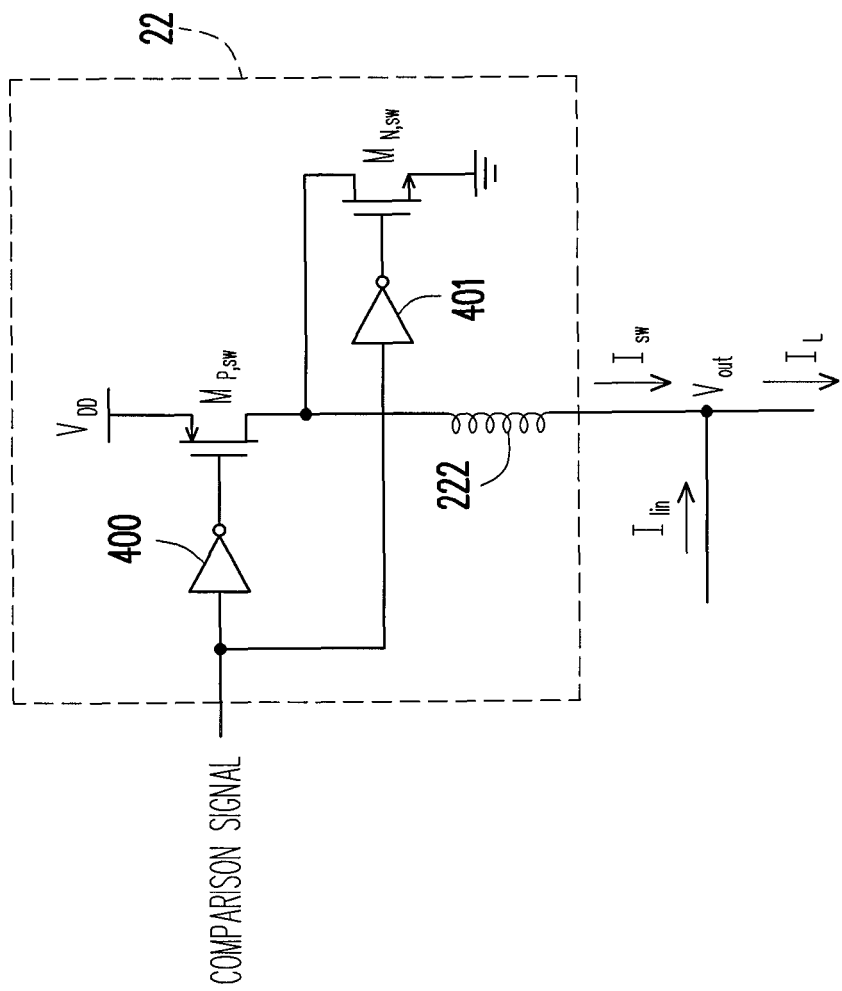
FIG. 4 is a detailed circuit diagram showing a switching amplifier according to another one exemplary embodiment of the present disclosure.

It is noted that the switching amplifier 22 have another implementation in the present disclosure. Referring to FIG. 4, FIG. 4 is a detailed circuit diagram showing a switching amplifier according to another one exemplary embodiment of the present disclosure. Being different from FIG. 2, the first buffer 220 is replaced by a first inverter 400, and the second buffer 221 is replaced by a second inverter 401. The first and second inverters 400, 401 output the inversed and buffered comparison signal. The other elements of the switching amplifiers 22 in FIG. 2 and FIG. 4 are identical, and thus the related description is omitted.

Figure 5:
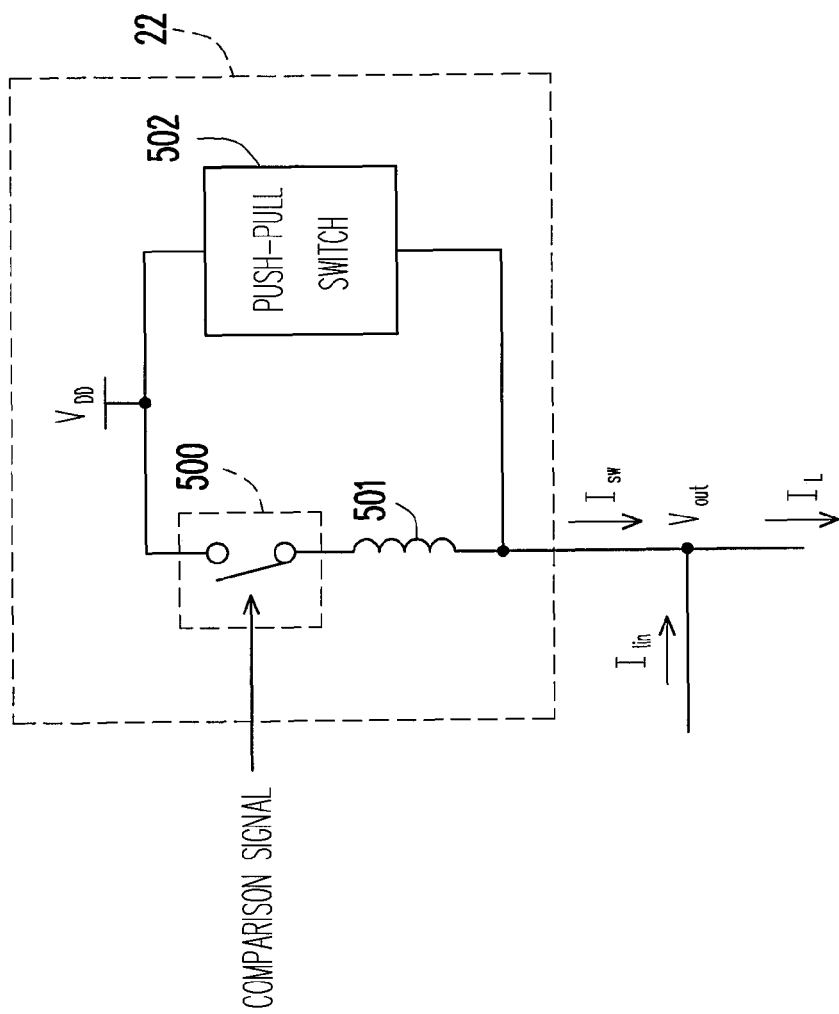
FIG. 5 is a detailed circuit diagram showing a switching amplifier according to another one exemplary embodiment of the present disclosure.

Referring to FIG. 5, FIG. 5 is a detailed circuit diagram showing a switching amplifier according to another one exemplary embodiment of the present disclosure. The switching amplifier 22 in FIG. 5 comprises a switch 500, a push-pull switch 502, and an inductive load 501. A first end of the push-pull switch 502 is coupled to the power voltage $V_{DD}$, and a second end of the push-pull switch 502 is coupled to the load node. A control end of the switch 500 is used to receive the comparison signal, and a first end of the switch 500 is coupled to a power voltage $V_{DD}$. One end of the inductive load 501 is coupled to a second end of the switch 500, and the other end of the inductive load 501 is coupled to the load node.

Figure 6:
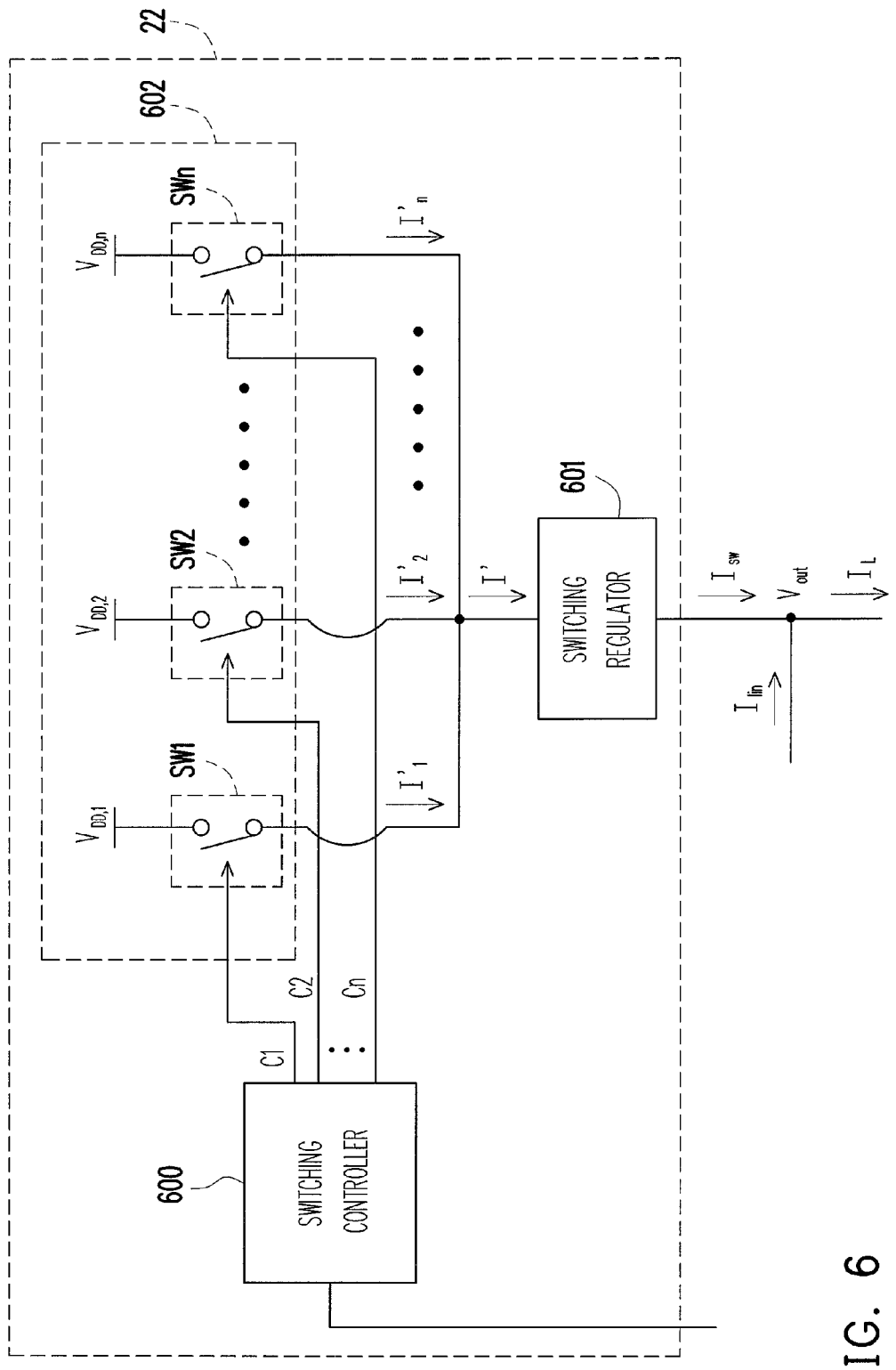
FIG. 6 is a detailed circuit diagram showing a switching amplifier according to another one exemplary embodiment of the present disclosure.

Further referring to FIG. 6, FIG. 6 is a detailed circuit diagram showing a switching amplifier according to another one exemplary embodiment of the present disclosure. The switching amplifier 22 in FIG. 6 comprises an switching controller 600, a switching regulator 601, and a voltage controlled current source 602. The switching controller 600 converts the comparison signal to a plurality of switching control signals C1~Cn. The voltage controlled current source 602 provides a determined current I' according to the switching control signals C1~Cn. The switching regulator 601 regulates the determined current I', so as to output a switching current $I_{sw}$ to the load node. It is noted that the switching controller 600 may be an analog to thermometer code controller, an analog to binary code controller, or an analog to 1-of-n code controller.

The voltage controlled current source 602 comprises a first through $n^{th}$ switches SW1~SWn. A control end of the $i^{th}$ switch SWi is used to receive a $i^{th}$ one of the switching control signals Ci. A first end of the $i^{th}$ switch is coupled to a $i^{th}$ power voltage $V_{DD,i}$, and a second end of the $i^{th}$ switch SWi is coupled to an input end of the switching regulator 601, wherein, n is an integer larger than 1, and i is an integer from 1 through n. It is noted that power voltages $V_{DD,1}$~$V_{DD,n}$ can be identical to each other, or be different from each other. The $i^{th}$ switch SWi provides a current $I_i'$ to the input end of the switching regulator 601 according to the switching control signals Ci. The determined current I' is a composition of the currents $I_1'$~$I_n'$, and the input end of the switching regulator 601 is used to receive the determined current I'.

The linear amplifiers 210 and 2310 of the linear amplifier circuit 21 and the duplicate linear amplifier circuit 231 have the high linearity and the wide bandwidth. The architectures of the linear amplifiers 210 and 2310 are identical to each other. Herein the architecture of the linear amplifier 2310 is illustrated as the example, and description related to the architecture of the linear amplifier 210 is omitted.

Figure 7:
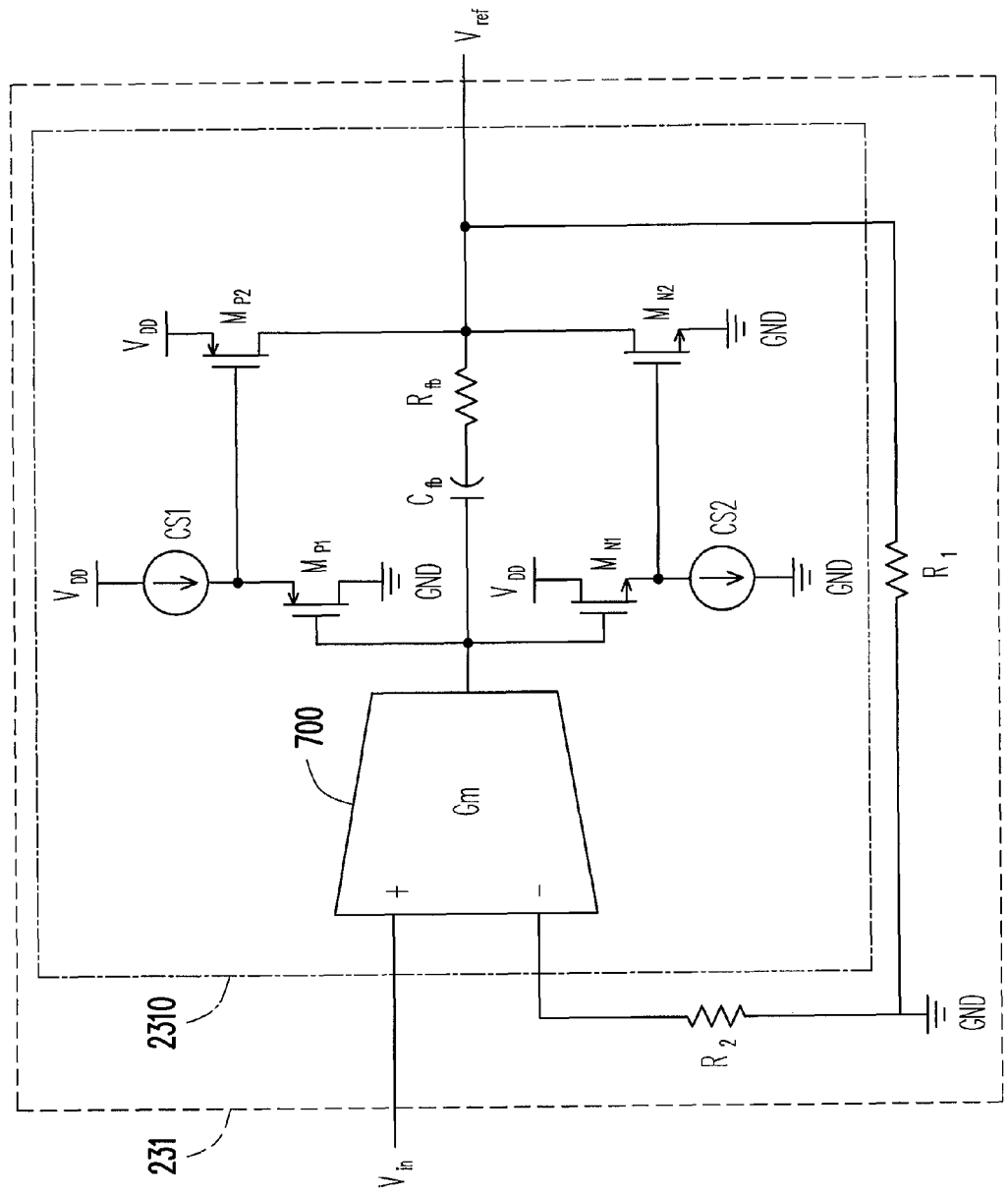
FIG. 7 is a detailed circuit diagram showing a linear amplifier of a duplicate linear amplifier circuit according to another one exemplary embodiment of the present disclosure.

Referring to FIG. 7, FIG. 7 is a detailed circuit diagram showing a linear amplifier of a duplicate linear amplifier circuit according to another one exemplary embodiment of the present disclosure. The linear amplifier 2310 comprises transconductor amplifier 700, a feedback capacitor $C_{fb}$, a feedback resistor $R_{fb}$, a first NMOS transistor $M_{N1}$, a second NMOS transistor $M_{N2}$, a first PMOS transistor $M_{P1}$, a second PMOS transistor $M_{P2}$, a first current source CS1, and a second current source CS2.

The feedback capacitor $C_{fb}$, the feedback resistor $R_{fb}$, the first NMOS transistor $M_{N1}$, the second NMOS transistor $M_{N2}$, the first PMOS transistor $M_{P1}$, the second PMOS transistor $M_{P2}$, the first current source CS1, and the second current source CS2 form a class-AB output stage formed. The transconductor amplifier 700 has the wide bandwidth, and the class-AB output stage has the high linearity.

The transconductor amplifier 700 has the positive end, the negative end, and a current output end. The transconductor amplifier 700 converts the input voltage signal $V_{in}$, so as to provide an output current flow through the current output end. The feedback capacitor $C_{fb}$ and the feedback resistor $R_{fb}$ are coupled between the output end of the duplicate linear amplifier circuit 231 and the current output end of the transconductor amplifier 700.

Gates of the first NMOS and PMOS transistors $M_{N1}$, $M_{P1}$ are coupled to the current output end. Sources of the first NMOS and PMOS transistors $M_{N1}$, $M_{P1}$ are respectively coupled to gates of the second NMOS and PMOS transistors $M_{N2}$, $M_{P2}$. Drains of the second NMOS and PMOS transistors $M_{N2}$, $M_{P2}$ are coupled to the output end of the duplicate linear amplifier circuit 231. Sources of the second NMOS and PMOS transistors $M_{N2}$, $M_{P2}$ are respectively coupled to the ground GND and the power voltage $V_{DD}$. The first and second current sources CS1, CS2 respectively coupled to the sources of the first NMOS and PMOS transistors $M_{N1}$, $M_{P1}$.

Figure 8:
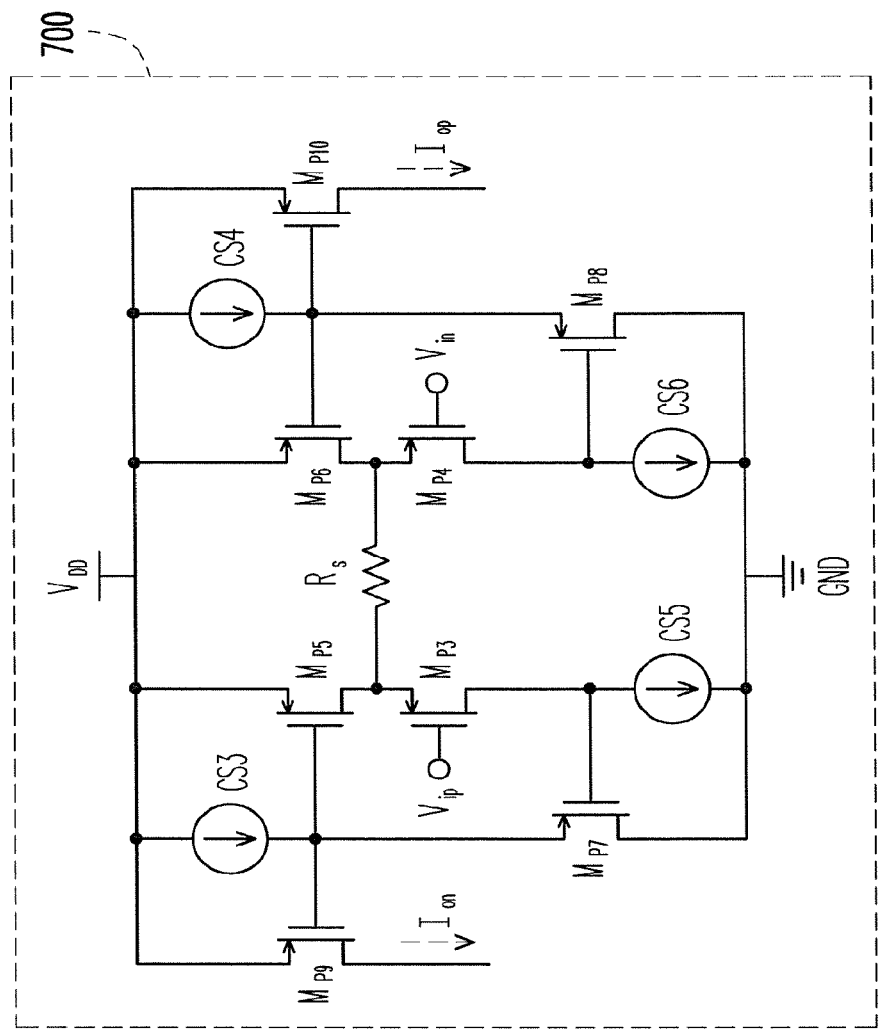
FIG. 8 is a detailed circuit diagram showing a transconductor amplifier according to another one exemplary embodiment of the present disclosure.

The transconductor amplifier 700 can be implemented by a differential transconductor amplifier. Referring to FIG. 8, FIG. 8 is a detailed circuit diagram showing a transconductor amplifier according to another one exemplary embodiment of the present disclosure. The transconductor amplifier 700 comprises a third through tenth PMOS transistors $M_{P3}$~$M_{P10}$, a third through sixth current sources CS1~CS6, and a source resistor $R_s$.

Gates of the third and fourth PMOS transistors $M_{P3}$, $M_{P4}$ are respectively coupled to the negative input end and the positive input end of the transconductor amplifier 700. The source resistor $R_s$ is coupled between sources of the third and fourth PMOS transistors $M_{P3}$, $M_{P4}$. Drains of the fifth and sixth PMOS transistors $M_{P5}$, $M_{P6}$ are respectively coupled to the sources of the third and fourth PMOS transistors $M_{P3}$, $M_{P4}$, and sources of the fifth and sixth PMOS transistors $M_{P5}$, $M_{P6}$ are coupled to the power voltage $V_{DD}$.

Gates of the seventh and eighth PMOS transistors $M_{P7}$, $M_{P8}$ are respectively coupled to drains of the third and fourth PMOS transistors $M_{P3}$, $M_{P4}$ drains of the seventh and eighth PMOS transistors $M_{P7}$, $M_{P8}$ are coupled the ground GND, and sources of the seventh and eighth PMOS transistors $M_{P7}$, $M_{P8}$ are respectively coupled to gates of the fifth and sixth PMOS transistors $M_{P5}$, $M_{P6}$.

The third and fourth current sources CS3, CS4 are respectively coupled to the sources of the seventh and eighth PMOS transistors $M_{P7}$, $M_{P8}$, and the fifth and sixth current sources CS5, CS6 are respectively coupled to the drains of third and fourth PMOS transistors $M_{P3}$, $M_{P4}$. Sources of the ninth and tenth PMOS transistors $M_{P9}$, $M_{P10}$ are coupled to the power voltage $V_{DD}$, gates of the ninth and tenth PMOS transistors $M_{P9}$, $M_{P10}$ are respectively coupled to the sources of the seventh and eighth PMOS transistors $M_{P7}$, $M_{P8}$, and drains of the ninth and tenth PMOS transistors $M_{P9}$, $M_{P10}$ respectively provide an negative and positive output currents $I_{on}$, $I_{op}$ forming the output current.

The feedforward controlled envelope modulator 20 may output a ripple voltage, and the ripple voltage is a product of a ripple current and an output resistance. Thus, the architecture of non-inverting amplifier is used to be applied in the linear amplifiers 2310 and 210, so as to reduce the output resistance. The linear amplifiers 2310 and 210 have a close loop bandwidth over 100 megahertz. The biasing current for driving the linear amplifier 210 of the linear amplifier circuit 21 is 350 milli-amperes, but the biasing current for driving the linear amplifier 2310 of the duplicate linear amplifier circuit 231 is merely several milli-amperes.

In the differential design manner of the transconductor amplifier 700, the source resistor $R_s$ is a passive element, but not an active element, such as an active resistor implemented by a transistor. Since the MOS transistor has the non-linear effect when it operates in the triode region to serve as an active resistor, in the exemplary embodiment, the passive resistor is used to serve as the source resistor $R_s$. In addition, the biasing voltages $V_{sg}$ of the third and fourth PMOS transistors $M_{P3}$, $M_{P4}$ are maintained fixed, because the feedback path formed by the seventh and eighth PMOS transistors $M_{P7}$, $M_{P8}$ lets the currents flow through the third and fourth PMOS transistors $M_{P3}$, $M_{P4}$ be fixed, and a differential signal is thus applied on the source resistor $R_s$ by the third and fourth PMOS transistors $M_{P4}$, $M_{P4}$.

Assuming the channel size ratio $(W/L)_{P3}$ and $(W/L)_{P4}$ of the third and fourth PMOS transistors $M_{P3}$, $M_{P4}$ are identical to each other, and the sizes of the fifth and sixth PMOS transistors $M_{P5}$, $M_{P6}$ are identical to the seventh and eighth PMOS transistors $M_{P7}$, $M_{P8}$, the transconductor amplifying gain $G_m$ of the transconductor amplifier 700 is expressed as $G_m=(I_{op}-I_{on})/(V_{ip}-V_{in})=-(2/g_{m3,4}+R_s)^{-1}$, wherein $g_{m3,4}$ represents the transconductor amplifying gain of the third and fourth PMOS transistors $M_{P3}$, $M_{P4}$, and $V_{ip}$, $V_{in}$ respectively represent the voltages at the positive and negative input ends of the transconductor amplifier 700. When the transconductor amplifying gain $g_{m3,4}$ of the third and fourth PMOS transistors $M_{P3}$, $M_{P4}$ is ultra larger than 2 (i.e. $g_{m3,4} \gg 2$), the transconductor amplifying gain $G_m$ of the transconductor amplifier 700 will be reduced to be $-1/R_s$. The feedback capacitor $C_{fb}$ is a miller capacitor used to compensate the phase margins of the linear amplifiers 2310 and 210.

Figure 9:
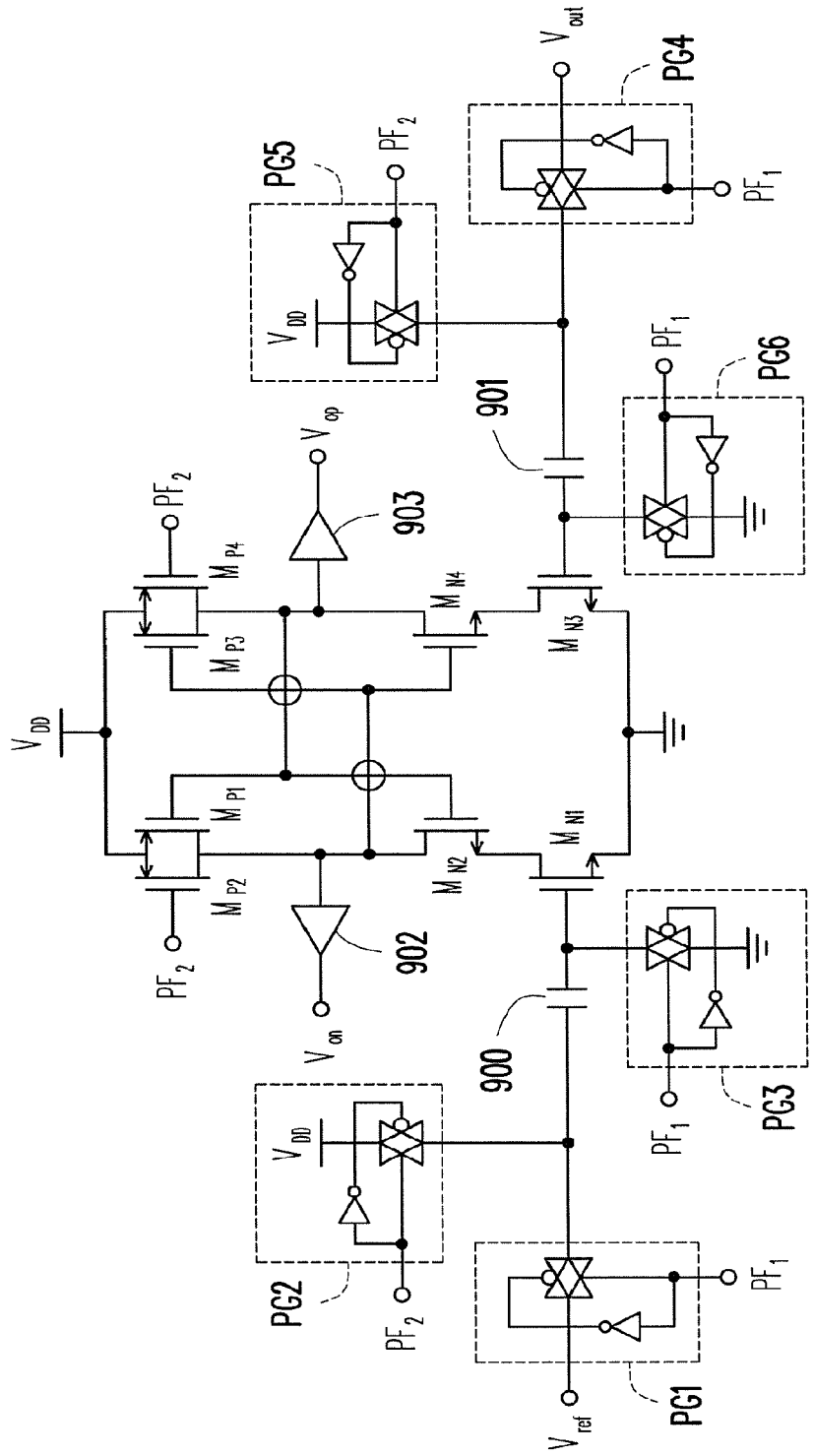
FIG. 9 is a detailed circuit diagram showing a hysteresis comparator according to another one exemplary embodiment of the present disclosure.

A dynamic technology is adopted to design the hysteresis comparator 232, such that the offset endurance of the hysteresis comparator 232 is reduced, and the hysteresis comparator 232 can have characteristics of low power consumption and high speed switching. Referring to FIG. 9, FIG. 9 is a detailed circuit diagram showing a hysteresis comparator according to another one exemplary embodiment of the present disclosure. The hysteresis comparator 232 comprises a first through sixth transmission gates PG1~PG6, a first and second capacitors 900, 901, a first through fourth NMOS transistors $M_{N1}$~$M_{N4}$, a first through fourth PMOS transistors $M_{P1}$~$M_{P4}$, and a first and second buffers 902, 903.

A first end of the first transmission gate PG1 receives the reference voltage signal Vref. A control and inversed control ends of the first transmission gate PG1 respectively receive a first control signal PF1 and a first inversed control signal. A second end of the first transmission gate PG1 is coupled to a first end of the first capacitor 900 and a second end of the second transmission gate PG2. A first end of the second transmission gate PG2 is coupled to the power voltage VDD. A control and inversed control ends of the second transmission gate PG2 respectively receive a second control signal PF2 and a second inversed control signal. A second end of the first capacitor 900 is coupled to a gate of the first NMOS transistor MN1. A second end of the third transmission gate PG1 is coupled to the gate of the first NMOS transistor MN1. A first end of the third transmission gate PG1 is coupled to the ground GND. A control and inversed control ends of the third transmission gate PG3 respectively receive the first control signal PF1 and the first inversed control signal. A source of the first NMOS transistor MN1 is coupled to the ground GND. A drain of the first NMOS transistor MN1 is coupled to a source of the second NMOS transistor MN2. A gate of the second NMOS transistor MN2 is coupled to a gate of the first PMOS transistor MP1. A drain of the second NMOS transistor MN2 is coupled to an input end of the first buffer 902. An output end of the first buffer 902 outputs a negative comparison signal Von. Drains of the first and second PMOS transistor MP1, MP2 are coupled to the input end of the first buffer 902. A gate of the second PMOS transistor MP2 receives the second control signal PF2, and sources of the first and second PMOS transistors MP1, MP2 are coupled to the power voltage VDD.

A first end of the fourth transmission gate PG4 receives the output voltage signal $V_{out}$. A control and inversed control ends of the fourth transmission gate PG4 respectively receive the first control signal $PF_1$ and the second inversed control signal. A second end of the fourth transmission gate PG4 is coupled to a first end of the second capacitor 901 and a second end of the fifth transmission gate PG5. A first end of the fifth transmission gate PG5 is coupled to the power voltage $V_{DD}$. A control and inversed control ends of the fifth transmission gate PG5 respectively receive the second control signal $PF_2$ and the second inversed control signal. A second end of the second capacitor 901 is coupled to a gate of the third NMOS transistor $M_{N3}$. A second end of the sixth transmission gate PG6 is coupled to the gate of the third NMOS transistor $M_{N3}$. A first end of the sixth transmission gate PG6 is coupled to the ground GND. A control and inversed control ends of the sixth transmission gate PG6 respectively receive the first control signal $PF_1$ and the first inversed control signal. A source of the third NMOS transistor $M_{N3}$ is coupled to the ground GND. A drain of the third NMOS transistor $M_{N3}$ is coupled to a source of the fourth NMOS transistor $M_{N4}$. A gate of the fourth NMOS transistor $M_{N4}$ is coupled to a gate of the third PMOS transistor $M_{P3}$. A drain of the fourth NMOS transistor $M_{N4}$ is coupled to an input end of the second buffer 903. An output end of the second buffer 903 outputs a positive comparison signal $V_{op}$. Drains of the third and fourth PMOS transistor $M_{P3}$, $M_{P4}$ are coupled to the input end of the second buffer 903. A gate of the fourth PMOS transistor $M_{P4}$ receives the second control signal $PF_2$. Sources of the third and fourth PMOS transistors $M_{P3}$, $M_{P4}$ are coupled to the power voltage $V_{DD}$.

The input end of the first buffer 902 is further coupled to the gates of the fourth NMOS and third PMOS transistors $M_{N4}$, $M_{P3}$. The input end of the second buffer 903 is further coupled to the gates of the second NMOS and first PMOS transistors $M_{N1}$, $M_{P1}$. The positive and negative comparison signals $V_{op}$, $V_{on}$ form the comparison signal.

The first and second capacitors 900, 901 are sampling capacitors used to respectively store the differential signals of the reference voltage signal $V_{ref}$ and the output voltage signal $V_{out}$. The first and second capacitors 900, 901 are further used to isolate the direct current biasing voltages from the linear amplifier circuit 21 and the duplicated linear amplifier circuit 231. The first through sixth transmission gates PG1~PG6 are used to serve as the sample-hold switches of the hysteresis comparator 232, thus increasing the switching speed. In addition, the first and second buffers 902, 903 are output buffers of the hysteresis comparator 232. The first and second buffers 902, 903 are used to adjust the output level of the hysteresis comparator 232.

The first and second control signals $PF_1$ and $PF_2$ can be the square signals with the frequencies 80 megahertz, and the first control signal $PF_1$ is the second inversed control signal. When the first control signal $PF_1$ is enabled, the reference voltage signal $V_{ref}$ and the output voltage signal $V_{out}$ are respectively stored in the first and second capacitors 900, 901, and the first and third PMOS transistors $M_{P1}$, $M_{P3}$ work in the sub-threshold region, thus reducing the power consumption. By contrary, when the second control signal $PF_2$ is enabled, the first and third NMOS transistors $M_{N1}$, $M_{N3}$ amplify the voltage signals stored in the first and second capacitors 900, 901, and the drains of the first and third NMOS transistors $M_{N1}$, $M_{N3}$ are push down to states of the low level.

In summary, the feedforward controlled envelope modulator might not need a small current sensing resistor, and thus effect of the process variation could be reduced. Furthermore, the feedforward controlled envelope modulator has the high transient response, such that the feedforward controlled envelope modulator can process the voltage signal with the wide range (i.e. the linearity thereof is improved) and the fast varying signal. By using the feedforward control mechanism, the linear amplifier circuit and the switching amplifier of the feedforward controlled envelope modulator can output a stable output current, so as to improve the efficiency of the polar transmitter, and might save the energy of the battery of the handheld communication device. Accordingly, the feedforward controlled envelope modulator can process the packet signal of the IEEE 802.11g standard or the other high speed communication standard.

It will be apparent to those skilled in the art that various modifications and variations can be made to the structure of the present disclosure without departing from the scope or spirit of the disclosure. In view of the foregoing descriptions, it is intended that the present disclosure covers modifications and variations of this disclosure if they fall within the scope of the following claims and their equivalents.

What is claimed is:

1. A feedforward controlled envelope modulator, comprising:
   a linear amplifier circuit, for amplifying an input voltage signal, so as to output an output voltage signal to a load node;
   a switching amplifier, for receiving a comparison signal, and outputting a switching current to the load node according to the comparison signal; and
   a feedforward control circuit, comprising:
      a duplicate linear amplifier circuit, for amplifying the input voltage signal, so as to output a reference voltage signal, wherein an amplifying gain of the duplicate linear amplifier circuit is identical to an amplifying gain of the linear amplifier circuit; and
      a hysteresis comparator, for comparing the output voltage signal and the reference voltage signal, so as to output the comparison signal.

2. The feedforward controlled envelope modulator according to claim 1, further comprising:
   a power amplifier, having a bias terminal coupled to the load node.

3. The feedforward controlled envelope modulator according to claim 1, wherein the linear amplifier circuit comprising:
   a first resistor;
   a second resistor; and
   a linear amplifier, having a positive input end, a negative input end, and an output end, wherein the positive input end receives the input voltage signal, and the negative input end is coupled to a ground via the second resistor, and coupled to the output end via the first resistor.

4. The feedforward controlled envelope modulator according to claim 1, wherein the duplicate linear amplifier circuit comprising:
   a first resistor;
   a second resistor; and
   a linear amplifier, having a positive input end, a negative input end, and an output end, wherein the positive input end receives the input voltage signal, and the negative input end is coupled to a ground via the second resistor, and coupled to the output end via the first resistor.

5. The feedforward controlled envelope modulator according to claim 1, wherein the switching amplifier comprising:
   a first buffer, for buffering the comparison signal;
   a second buffer, for buffering the comparison signal;
   a first switching transistor, being a P-type metal-oxide-semiconductor (PMOS) transistor, wherein the first buffer is coupled between a gate of the first switch transistor and the hysteresis comparator;
   a second switching transistor, being a N-type metal-oxide-semiconductor (NMOS) transistor, wherein the second buffer is coupled between a gate of the second switching transistor and the hysteresis comparator; and
   an inductive load, one end thereof is coupled to drains of the first and second switching transistors, and the other end thereof is coupled to the load node;
   wherein sources of the first and second switching transistors are respectively coupled to a power voltage and a ground.

6. The feedforward controlled envelope modulator according to claim 5, wherein switching amplifier further comprising:
   a diode, an input end thereof is coupled to the ground, and an output end thereof is coupled to the drains of the first and second switching transistors.

7. The feedforward controlled envelope modulator according to claim 1, wherein the switching amplifier comprising:
   a dead time generator, for receiving the comparison signal, preventing a shoot-through loss, and outputting a first processed signal and a second processed signal;
   a first and second N-stage buffers, wherein the first N-stage buffer buffers the first processed signal and the second N-stage buffer buffers the second processed signal, and N is an positive integer larger than 0;
   a first switching transistor, being a PMOS transistor, a gate thereof is coupled to an output of the first N-stage buffer, and a source thereof is coupled to the power voltage;
   a second switching transistor, being a NMOS transistor, a gate thereof is coupled to an output of the second N-stage buffer, and a source thereof is coupled to the ground; and
   an inductive load, one end thereof is coupled to drains of the first and second switching transistors, and the other end thereof is coupled to the load node.

8. The feedforward controlled envelope modulator according to claim 7, wherein the dead time generator further comprises:
   a first inverter, for receiving the comparison signal;
   a second inverter, an input thereof is coupled to an output of the first inverter, and an output thereof outputs the first processed signal;
   a third inverter, for receiving the first processed signal; and
   a NAND gate, having a first input terminal, a second input terminal, and a third input terminal, the first input terminal thereof is coupled to the output of the first inverter, the second input terminal thereof is coupled to an output of the third inverter, and the output thereof outputs the second processed signal.

9. The feedforward controlled envelope modulator according to claim 8, wherein the first inverter comprises a first PMOS transistor and a first NMOS transistor, the second inverter comprises a second PMOS transistor and a second NMOS transistor, the third inverter comprises a fifth PMOS transistor and a fifth NMOS transistor, the NAND gate comprises a sixth PMOS transistor, a sixth NMOS transistor, and a ninth PMOS transistor, the first N-stage buffer comprises a third PMOS transistor, a fourth PMOS transistor, a third NMOS transistor, and a fourth NMOS transistor, the second N-stage buffer comprises a seventh PMOS transistor, a eighth PMOS transistor, a seventh NMOS transistor, and a eighth NMOS transistor; gates of first NMOS and PMOS transistors receive the comparison signal, drains of the first NMOS and PMOS transistors are coupled to each other, gates of second NMOS and PMOS transistors are coupled to the drains of the first NMOS and PMOS transistors, drains of the second NMOS and PMOS transistors are coupled to each other, gates of third NMOS and PMOS transistors are coupled to the drains of the second NMOS and PMOS transistors, drains of the third NMOS and PMOS transistors are coupled to each other, gates of fourth NMOS and PMOS transistors are coupled to the drains of the third NMOS and PMOS transistors, drains of the fourth NMOS and PMOS transistors are coupled to each other, gates of the fifth NMOS and PMOS transistors are coupled to the drains of the second NMOS and PMOS transistors, drains of the fifth NMOS and PMOS transistors are coupled to each other, a gate of the ninth PMOS transistor is coupled to the drains of the fifth NMOS and PMOS transistors, gates of the sixth NMOS and PMOS transistors are coupled to the drains of the first NMOS and PMOS transistors, drains of the ninth PMOS transistor and sixth NMOS transistor are coupled to each other, a drain of the sixth PMOS transistor is coupled to a source of the ninth PMOS transistor, gates of the seventh NMOS and PMOS transistors are coupled to the drains of the ninth PMOS transistor and sixth NMOS transistor, drains of the seventh NMOS and PMOS transistors are coupled to each other, gates of the eighth NMOS and PMOS transistors are coupled to the drains of the seventh NMOS and PMOS transistors, drains of the eighth NMOS and PMOS transistors are coupled to each other, sources of the first through eighth PMOS transistors are coupled to a power voltage, and sources of the first through eighth NMOS transistors are coupled to a ground; a gate of the first switching transistor is coupled to the drains of the fourth NMOS and PMOS transistors, a gate of the second switching transistor is coupled to the drains of the eighth NMOS and PMOS transistors.

10. The feedforward controlled envelope modulator according to claim 1, wherein the switching amplifier comprising:
a first inverter, for inverting the comparison signal;
a second inverter, for inverting the comparison signal;
a first switching transistor, being a PMOS transistor, wherein the first inverter is coupled between a gate of the first switch transistor and the hysteresis comparator;
a second switching transistor, being a NMOS transistor, wherein the second inverter is coupled between a gate of the second switching transistor and the hysteresis comparator; and
an inductive load, one end thereof is coupled to drains of the first and second switching transistors, and the other end thereof is coupled to the load node;
wherein sources of the first and second switching transistors are respectively coupled to a power voltage and a ground.

11. The feedforward controlled envelope modulator according to claim 1, wherein the switching amplifier comprising:
a push-pull switch, a first end thereof is coupled to a power voltage, and a second end thereof is coupled to the load node;
a switch, a control end thereof is used to receive the comparison signal, and a first end thereof is coupled to a power voltage; and
an inductive load, one end thereof is coupled to a second end of the switch, and the other end thereof is coupled to the load node.

12. The feedforward controlled envelope modulator according to claim 1, wherein the switching amplifier comprising:
an switching controller, for converting the comparison signal to a plurality of switching control signals;
a voltage controlled current source, for providing a determined current according to the switching control signals; and
a switching regulator, for regulating the determined current, so as to output a switching current to the load node.

13. The feedforward controlled envelope modulator according to claim 12, wherein the voltage controlled current source comprising:
a first through $n^{th}$ switches, wherein a control end of the $i^{th}$ switch is used to receive a $i^{th}$ one of the switching control signals, a first end of the $i^{th}$ switch is coupled to a $i^{th}$ power voltage, and a second end of the $i^{th}$ switch is coupled to an input end of the switching regulator, wherein the input end of the switching regulator is used to receive the determined current, n is an integer larger than 1, and i is an integer from 1 through n.

14. The feedforward controlled envelope modulator according to claim 1, wherein a biasing current for driving the duplicate linear amplifier circuit is less than a biasing current for driving the linear amplifier circuit.

15. The feedforward controlled envelope modulator according to claim 3, wherein the linear amplifier comprising:
a transconductor amplifier, having the positive end, the negative end, and a current output end, for converting the input voltage signal, so as to provide an output current flow through the current output end;
a feedback capacitor and a feedback resistor, both of them are coupled between the output end and the current output end; and
a first and second NMOS transistors, a first and second PMOS transistors, and a first and second current sources;
wherein gates of the first NMOS and PMOS transistors are coupled to the current output end, sources of the first NMOS and PMOS transistors are respectively coupled to gates of the second NMOS and PMOS transistors, drains of the second NMOS and PMOS transistors are coupled to the output end, sources of the second NMOS and PMOS transistors are respectively coupled to the ground and a power voltage, and the first and second current sources respectively coupled to the sources of the first NMOS and PMOS transistors.

16. The feedforward controlled envelope modulator according to claim 15, wherein the transconductor amplifier comprising:
a third and fourth PMOS transistors, gates thereof are respectively coupled to the negative input end and the positive input end;
a source resistor, coupled between sources of the third and fourth PMOS transistors;
a fifth and sixth PMOS transistors, drains thereof are respectively coupled to the sources of the third and fourth PMOS transistors, and sources thereof are coupled to the power voltage;
a seventh and eighth PMOS transistors, gates thereof are respectively coupled to drains of the third and fourth PMOS transistors, drains thereof are coupled the ground, and sources thereof are respectively coupled to gates of the fifth and sixth PMOS transistors;
a third through sixth current sources, wherein the third and fourth current sources are respectively coupled to the sources of the seventh and eighth PMOS transistors, and the fifth and sixth current sources are respectively coupled to the drains of third and fourth PMOS transistors; and a ninth and tenth PMOS transistors, sources thereof are coupled to the power voltage, gates thereof are respectively coupled to the sources of the seventh and eighth PMOS transistors, and drains thereof respectively provide an negative and positive output currents forming the output current.

17. The feedforward controlled envelope modulator according to claim 4, wherein the duplicate linear amplifier circuit comprising:

a transconductor amplifier, having the positive input end, the negative input end, and a current output end, for converting the input voltage signal, so as to provide an output current flow through the current output end;

a feedback capacitor and a feedback resistor, both of them are coupled between the output end and the current output end; and a first and second NMOS transistors, a first and second PMOS transistors, and a first and second current sources;

wherein gates of the first NMOS and PMOS transistors are coupled to the current output end, sources of the first NMOS and PMOS transistors are respectively coupled to gates of the second NMOS and PMOS transistors, drains of the second NMOS and PMOS transistors are coupled to the output end, sources of the second NMOS and PMOS transistors are respectively coupled to the ground and a power voltage, and the first and second current sources respectively coupled to the sources of the first NMOS and PMOS transistors.

18. The feedforward controlled envelope modulator according to claim 17, wherein the transconductor amplifier comprising:

a third and fourth PMOS transistors, gates thereof are respectively coupled to the negative input end and the positive input end;

a source resistor, coupled between sources of the third and fourth PMOS transistors;

a fifth and sixth PMOS transistors, drains thereof are respectively coupled to the sources of the third and fourth PMOS transistors, and sources thereof are coupled to the power voltage;

a seventh and eighth PMOS transistors, gates thereof are respectively coupled to drains of the third and fourth PMOS transistors, drains thereof are coupled the ground, and sources thereof are respectively coupled to gates of the fifth and sixth PMOS transistors;

a third through sixth current sources, wherein the third and fourth current sources are respectively coupled to the sources of the seventh and eighth PMOS transistors, and the fifth and sixth current sources are respectively coupled to the drains of third and fourth PMOS transistors; and a ninth and tenth PMOS transistors, sources thereof are coupled to the power voltage, gates thereof are respectively coupled to the sources of the seventh and eighth PMOS transistors, and drains thereof respectively provide an negative and positive output currents forming the output current.

19. The feedforward controlled envelope modulator according to claim 1, wherein the hysteresis comparator comprising:

a first through third transmission gates, a first capacitor, a first and second NMOS transistors, a first and second PMOS transistors, and a first buffer, wherein a first end of the first transmission gate receives the reference voltage signal, a control and inversed control ends of the first transmission gate respectively receive a first control and inversed control signals, a second end of the first transmission gate is coupled to a first end of the first capacitor and a second end of the second transmission gate, a first end of the second transmission gate is coupled to a power voltage, a control and inversed control ends of the second transmission gate respectively receive a second control and inversed control signals, a second end of the first capacitor is coupled to a gate of the first NMOS transistor, a second end of the third transmission gate is coupled to the gate of the first NMOS transistor, a first end of the third transmission gate is coupled to a ground, a control and inversed control ends of the third transmission gate respectively receive the first control and inversed control signals, a source of the first NMOS transistor is coupled to the ground, a drain of the first NMOS transistor is coupled to a source of the second NMOS transistor, a gate of the second NMOS transistor is coupled to a gate of the first PMOS transistor, a drain of the second NMOS transistor is coupled to an input end of the first buffer, an output end of the first buffer outputs a negative comparison signal, drains of the first and second PMOS transistor are coupled to the input end of the first buffer, a gate of the second PMOS transistor receives the second control signal, and sources of the first and second PMOS transistors are coupled to the power voltage; and a fourth through sixth transmission gates, a second capacitor, a third and fourth NMOS transistors, a third and fourth PMOS transistors, and a second buffer, wherein a first end of the fourth transmission gate receives the output voltage signal, a control and inversed control ends of the fourth transmission gate respectively receive the first control and inversed control signals, a second end of the fourth transmission gate is coupled to a first end of the second capacitor and a second end of the fifth transmission gate, a first end of the fifth transmission gate is coupled to the power voltage, a control and inversed control ends of the fifth transmission gate respectively receive the second control and inversed control signals, a second end of the second capacitor is coupled to a gate of the third NMOS transistor, a second end of the sixth transmission gate is coupled to the gate of the third NMOS transistor, a first end of the sixth transmission gate is coupled to the ground, a control and inversed control ends of the sixth transmission gate respectively receive the first control and inversed control signals, a source of the third NMOS transistor is coupled to the round, a drain of the third NMOS transistor is coupled to a source of the fourth NMOS transistor, a gate of the fourth NMOS transistor is coupled to a gate of the third PMOS transistor, a drain of the fourth NMOS transistor is coupled to an input end of the second buffer, an output end of the second buffer outputs a positive comparison signal, drains of the third and fourth PMOS transistor are coupled to the input end of the second buffer, a gate of the fourth PMOS transistor receives the second control signal, and sources of the third and fourth PMOS transistors are coupled to the power voltage;

wherein the input end of the first buffer is further coupled to the gates of the fourth NMOS and third PMOS transistors, the input end of the second buffer is further coupled to the gates of the second NMOS and first PMOS transistors, and the positive and negative comparison signals form the comparison signal.

20. A feedforward control circuit, used in a feedforward controlled envelope modulator, comprising:

a duplicate linear amplifier circuit, for amplifying an input voltage signal, so as to output a reference voltage signal, wherein an amplifying gain of the duplicate linear amplifier circuit is identical to an amplifying gain of a linear amplifier circuit of the feedforward controlled envelope modulator, and the linear amplifier circuit amplifies the input voltage signal, so as to output an output voltage signal to a load node of the feedforward controlled envelope modulator; and a hysteresis comparator, for comparing the output voltage signal and the reference voltage signal, so as to output a comparison signal to a switching amplifier of the feedforward controlled envelope modulator, wherein the switching amplifier receives a comparison signal, and outputs the switching current to the load node according to the comparison signal.

21. The feedforward control circuit according to claim 20, wherein the duplicate linear amplifier circuit comprising:

a first resistor;

a second resistor; and a linear amplifier, having a positive input end, a negative input end, and an output end, wherein the positive input end receives the input voltage signal, and the negative input end is coupled to a ground via the second resistor, and coupled to the output end via the first resistor.

22. The feedforward control circuit according to claim 21, wherein the linear amplifier comprising:

a transconductor amplifier, having the positive end, the negative end, and a current output end, for converting the input voltage signal, so as to provide an output current flow through the current output end;

a feedback capacitor and a feedback resistor, both of them are coupled between the output end and the current output end; and a first and second NMOS transistors, a first and second PMOS transistors, and a first and second current sources;

wherein gates of the first NMOS and PMOS transistors are coupled to the current output end, sources of the first NMOS and PMOS transistors are respectively coupled to gates of the second NMOS and PMOS transistors, drains of the second NMOS and PMOS transistors are coupled to the output end, sources of the second NMOS and PMOS transistors are respectively coupled to the ground and a power voltage, and the first and second current sources respectively coupled to the sources of the first NMOS and PMOS transistors.

23. The feedforward control circuit according to claim 22, wherein the transconductor amplifier comprising:

a third and fourth PMOS transistors, gates thereof are respectively coupled to the negative input end and the positive input end;

a source resistor, coupled between sources of the third and fourth PMOS transistors;

a fifth and sixth PMOS transistors, drains thereof are respectively coupled to the sources of the third and fourth PMOS transistors, and sources thereof are coupled to the power voltage;

a seventh and eighth PMOS transistors, gates thereof are respectively coupled to drains of the third and fourth PMOS transistors, drains thereof are coupled the ground, and sources thereof are respectively coupled to gates of the fifth and sixth PMOS transistors;

a third through sixth current sources, wherein the third and fourth current sources are respectively coupled to the sources of the seventh and eighth PMOS transistors, and the fifth and sixth current sources are respectively coupled to the drains of third and fourth PMOS transistors; and a ninth and tenth PMOS transistors, sources thereof are coupled to the power voltage, gates thereof are respectively coupled to the sources of the seventh and eighth PMOS transistors, and drains thereof respectively provide an negative and positive output currents forming the output current.

24. The feedforward control circuit according to claim 20, wherein the hysteresis comparator comprising:

a first through third transmission gates, a first capacitor, a first and second NMOS transistors, a first and second PMOS transistors, and a first buffer, wherein a first end of the first transmission gate receives the reference voltage signal, a control and inversed control ends of the first transmission gate respectively receive a first control and inversed control signals, a second end of the first transmission gate is coupled to a first end of the first capacitor and a second end of the second transmission gate, a first end of the second transmission gate is coupled to a power voltage, a control and inversed control ends of the second transmission gate respectively receive a second control and inversed control signals, a second end of the first capacitor is coupled to a gate of the first NMOS transistor, a second end of the third transmission gate is coupled to the gate of the first NMOS transistor, a first end of the third transmission gate is coupled to a ground, a control and inversed control ends of the third transmission gate respectively receive the first control and inversed control signals, a source of the first NMOS transistor is coupled to the ground, a drain of the first NMOS transistor is coupled to a source of the second NMOS transistor, a gate of the second NMOS transistor is coupled to a gate of the first PMOS transistor, a drain of the second NMOS transistor is coupled to an input end of the first buffer, an output end of the first buffer outputs a negative comparison signal, drains of the first and second PMOS transistor are coupled to the input end of the first buffer, a gate of the second PMOS transistor receives the second control signal, and sources of the first and second PMOS transistors are coupled to the power voltage; and a fourth through sixth transmission gates, a second capacitor, a third and fourth NMOS transistors, a third and fourth PMOS transistors, and a second buffer, wherein a first end of the fourth transmission gate receives the output voltage signal, a control and inversed control ends of the fourth transmission gate respectively receive the first control and inversed control signals, a second end of the fourth transmission gate is coupled to a first end of the second capacitor and a second end of the fifth transmission gate, a first end of the fifth transmission gate is coupled to the power voltage, a control and inversed control ends of the fifth transmission gate respectively receive the second control and inversed control signals, a second end of the second capacitor is coupled to a gate of the third NMOS transistor, a second end of the sixth transmission gate is coupled to the gate of the third NMOS transistor, a first end of the sixth transmission gate is coupled to the ground, a control and inversed control ends of the sixth transmission gate respectively receive the first control and inversed control signals, a source of the third NMOS transistor is coupled to the ground, a drain of the third NMOS transistor is coupled to a source of the fourth NMOS transistor, a gate of the fourth NMOS transistor is coupled to a gate of the third PMOS transistor, a drain of the fourth NMOS transistor is coupled to an input end of the second buffer, an output end of the second buffer outputs a positive comparison signal, drains of the third and fourth PMOS transistor are coupled to the input end of the second buffer, a gate of the fourth PMOS transistor receives the second control signal, and sources of the third and fourth PMOS transistors are coupled to the power voltage;

wherein the input end of the first buffer is further coupled to the gates of the fourth NMOS and third PMOS transistors, the input end of the second buffer is further coupled to the gates of the second NMOS and first PMOS transistors, and the positive and negative comparison signals form the comparison signal.

25. The feedforward control circuit according to claim 20, wherein a biasing current for driving the duplicate linear amplifier circuit is less than a biasing current for driving the linear amplifier circuit.

* * * * *